(12) United States Patent
Park et al.

(10) Patent No.: US 11,430,963 B2
(45) Date of Patent: Aug. 30, 2022

(54) DISPLAY DEVICE INCLUDING BONDING MEMBER

(71) Applicant: Samsung Display Co., LTD., Yongin-si (KR)

(72) Inventors: Jun Su Park, Seoul (KR); Young Do Kim, Cheonan-si (KR); Young Moon Kim, Asan-si (KR); Kyung Lae Rho, Suwon-si (KR); Young Gil Park, Asan-si (KR); Ji Hye Seo, Cheonan-si (KR); Ki Cheol Song, Suwon-si (KR); Na Ri Ahn, Seongnam-si (KR); Jang Doo Lee, Hwaseong-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 265 days.

(21) Appl. No.: 16/658,857

(22) Filed: Oct. 21, 2019

(65) Prior Publication Data
US 2020/0266368 A1    Aug. 20, 2020

(30) Foreign Application Priority Data

Feb. 19, 2019    (KR) .................... 10-2019-0019405

(51) Int. Cl.
*H01L 51/00* (2006.01)
*B32B 7/12* (2006.01)
(Continued)

(52) U.S. Cl.
CPC ............ *H01L 51/0097* (2013.01); *B32B 7/12* (2013.01); *B32B 17/10027* (2013.01);
(Continued)

(58) Field of Classification Search
CPC ....... Y10T 428/24942; Y10T 428/2495; Y10T 428/249959; Y10T 428/24967;
(Continued)

(56) References Cited

U.S. PATENT DOCUMENTS

2014/0377520 A1* 12/2014 Chang .................... B32B 27/08
428/213
2015/0207102 A1    7/2015 Jeong et al.
(Continued)

FOREIGN PATENT DOCUMENTS

KR    1020170063344 A    6/2017
KR    1020170084402 A    7/2017
(Continued)

OTHER PUBLICATIONS

European Search Report for European Patent Application No. 20153270.2 dated Jul. 7, 2020.

*Primary Examiner* — Maria V Ewald
*Assistant Examiner* — Ethan A. Utt
(74) *Attorney, Agent, or Firm* — Cantor Colburn LLP

(57) ABSTRACT

A display device includes a display panel including a front surface and a second surface which is opposite to the front surface; a front laminated structure attached to the front surface of the display panel; and a rear laminated structure attached to the second surface of the display panel. Each of the front laminated structure and the rear laminated structure includes a bonding member, and an average modulus of the bonding member of the front laminated structure is smaller than an average modulus of the bonding member of the rear laminated structure.

20 Claims, 10 Drawing Sheets

(51) Int. Cl.
  *B32B 17/10* (2006.01)
  *H01L 27/32* (2006.01)
  *H01L 51/52* (2006.01)
  *G06F 3/041* (2006.01)

(52) U.S. Cl.
  CPC ...... *B32B 17/10458* (2013.01); *H01L 27/323* (2013.01); *H01L 27/3244* (2013.01); *H01L 51/524* (2013.01); *H01L 51/529* (2013.01); *H01L 51/5281* (2013.01); *B32B 2307/42* (2013.01); *B32B 2307/546* (2013.01); *B32B 2457/208* (2013.01); *G06F 3/0412* (2013.01); *G06F 2203/04102* (2013.01); *H01L 2251/5338* (2013.01)

(58) Field of Classification Search
  CPC ........... Y10T 428/24975; Y10T 428/26; Y10T 428/263; Y10T 428/264; Y10T 428/265; Y10T 428/269; Y10T 428/14; Y10T 428/1452; Y10T 428/1457; Y10T 428/1562; Y10T 428/1471; Y10T 428/1481; Y10T 428/28; Y10T 428/2848; Y10T 428/2852; Y10T 428/2878; Y10T 428/2883; Y10T 428/2887; Y10T 428/2891; Y10T 428/2896; Y10T 428/31507; Y10T 428/3154; Y10T 428/31616; Y10T 428/31623; Y10T 428/31645; Y10T 428/31649; Y10T 428/31663; Y10T 428/31667; Y10T 428/31721; Y10T 428/31786; Y10T 428/31797; Y10T 428/31855; Y10T 428/31909; Y10T 428/31913; Y10T 428/31917; Y10T 428/3192; Y10T 428/31924; Y10T 428/31928; Y10T 428/31931; Y10T 428/31935; Y10T 428/31938; B32B 7/00; B32B 7/02; B32B 7/022; B32B 7/04; B32B 7/12; B32B 27/00; B32B 27/02; B32B 27/04; B32B 27/06; B32B 27/08; B32B 27/28; B32B 27/281; B32B 27/283; B32B 27/286; B32B 27/30; B32B 27/302; B32B 27/304; B32B 27/306; B32B 27/308; B32B 27/32; B32B 27/36; B32B 27/365; B32B 27/40; B32B 2307/50; B32B 2307/546; B32B 2307/548; B32B 2457/00; B32B 2457/20; B32B 2457/202; B32B 2457/204; B32B 2457/206; B32B 2457/208; C09J 7/00; C09J 7/20; C09J 7/22; C09J 7/41; C09J 7/243; C09J 7/245; C09J 7/25; C09J 7/255; C09J 7/29; C09J 7/30; C09J 7/38; C09J 7/381; C09J 7/383; C09J 7/385; C09J 9/00; C09J 133/00; C09J 133/04; C09J 133/06; C09J 133/08; C09J 133/10; C09J 133/12; C09J 133/18; C09J 133/20; C09J 183/00; C09J 183/04; C09J 183/06; C09J 183/08; C09J 2203/318; C09J 2301/10; C09J 2301/12; C09J 2301/122; C09J 2301/124; C09J 2301/1242; C09J 2301/16; C09J 2301/162; C09J 2301/30; C09J 2301/312; H01L 51/00; H01L 51/0096; H01L 51/50; H01L 51/52; H01L 51/5237; H01L 51/5253; H01L 51/5256; H01L 51/5281; H01L 27/00; H01L 27/32; H01L 27/3225; H01L 27/323; H01L 23/34; H01L 23/36; H01L 23/373; H01L 23/3731; H01L 23/3733; H01L 23/3735; H01L 23/3736; H01L 23/3737; H01L 23/3738; G02B 1/00; G02B 1/04; G02B 1/10; G02B 1/11; G02B 1/111; G02B 1/113; G02B 1/115; G02B 1/116; G02B 1/118; G02B 1/14
  USPC ........ 428/212–216, 220, 332, 334–337, 339, 428/40.1, 41.3, 41.4, 41.5, 41.7, 41.9, 428/343, 354, 355 R, 355 EN, 355 BL, 428/355 CN, 355 AC, 355 N, 412, 421, 428/426, 428–430, 435, 441, 442, 428/446–448, 451, 473.5, 480, 483, 500, 428/515–523
  See application file for complete search history.

(56) References Cited

U.S. PATENT DOCUMENTS

| | | | |
|---|---|---|---|
| 2017/0200915 A1* | 7/2017 | Lee | H05K 1/028 |
| 2017/0247579 A1 | 8/2017 | Kwak et al. | |
| 2017/0309843 A1* | 10/2017 | Kim | B32B 7/02 |
| 2017/0368795 A1* | 12/2017 | Kutsumizu | B32B 9/00 |
| 2018/0046220 A1* | 2/2018 | Kim | H01L 51/0097 |
| 2018/0375043 A1 | 12/2018 | Jung et al. | |

FOREIGN PATENT DOCUMENTS

| | | |
|---|---|---|
| KR | 1020170097850 A | 8/2017 |
| KR | 1020170097851 A | 8/2017 |
| KR | 1020170097854 A | 8/2017 |
| KR | 1020170097856 A | 8/2017 |
| KR | 1020180012966 A | 2/2018 |
| KR | 1020180013067 A | 2/2018 |
| KR | 1020180028958 A | 3/2018 |
| KR | 1020180028959 A | 3/2018 |
| KR | 1020180028960 A | 3/2018 |
| KR | 1020180033016 A | 4/2018 |
| KR | 1020180047609 A | 5/2018 |
| KR | 1020180079096 A | 7/2018 |
| KR | 1020190000967 A | 1/2019 |

* cited by examiner

DISPLAY DEVICE INCLUDING BONDING MEMBER

This application claims priority to Korean Patent Application No. 10-2019-0019405 filed on Feb. 19, 2019, and all the benefits accruing therefrom under 35 U.S.C. 119, the contents of which in its entirety are herein incorporated by reference.

BACKGROUND

1. Field

The present disclosure relates to a display device, and more particularly to a foldable display device including a bonding member.

2. Description of the Related Art

An electronic device such as a smart phone, a tablet personal computer ("PC"), a digital camera, a laptop computer, a navigation system and a smart television ("TV"), which provides images to a user, includes a display device for displaying images.

A foldable display device has attracted much attention. Since the foldable display device has good portability and a relatively wide display screen, it may be advantageously used in a foldable electronic device such as a smart phone and a tablet PC.

SUMMARY

Embodiments of the present disclosure provide a display device including a bonding member, capable of reducing or effectively preventing defective detachment even in repeated folding operations.

However, embodiments of the present disclosure are not restricted to the one set forth herein. The above and other features of the present disclosure will become more apparent to one of ordinary skill in the art to which the present disclosure pertains by referencing the detailed description of the present disclosure given below.

An embodiment of a display device includes a display panel including a front surface and a rear surface opposite to each other; a front laminated structure attached to the front surface of the display panel; and a rear laminated structure attached to the rear surface of the display panel. Each of the front laminated structure and the rear laminated structure includes a bonding member, and an average modulus of the bonding member within the front laminated structure is smaller than an average modulus within the rear laminated structure.

An embodiment of a display device includes a display panel which is foldable and includes a display surface at which an image is displayed and a rear surface which is opposite to the display surface; a front laminated structure attached to the display surface of the display panel and foldable together with the display panel, the front laminated structure including a first thin film adhesive layer having a thickness of about 300 micrometers or less and a modulus of about 50 kilopascals to about 1 megapascal; and a rear laminated structure attached to the rear surface of the display panel and foldable together with the display panel. The display device which is in-folded disposes portions of the display surface facing each other with the first thin film adhesive layer therebetween.

According to one or more embodiment of the display device and a method of providing the display device, by controlling the actual modulus of bonding members by an indenter-measuring process, it is possible to precisely manage the adhesive properties such as defective detachment prevention, restoring force and peel force for each position of the bonding members included in the display device.

The effects of the present disclosure are not limited to the aforementioned effects, and various other effects are included in the present specification.

BRIEF DESCRIPTION OF THE DRAWINGS

The above and other features of the present disclosure will become more apparent by describing in detail exemplary embodiments thereof with reference to the attached drawings, in which.

DETAILED DESCRIPTION

Figure 1:
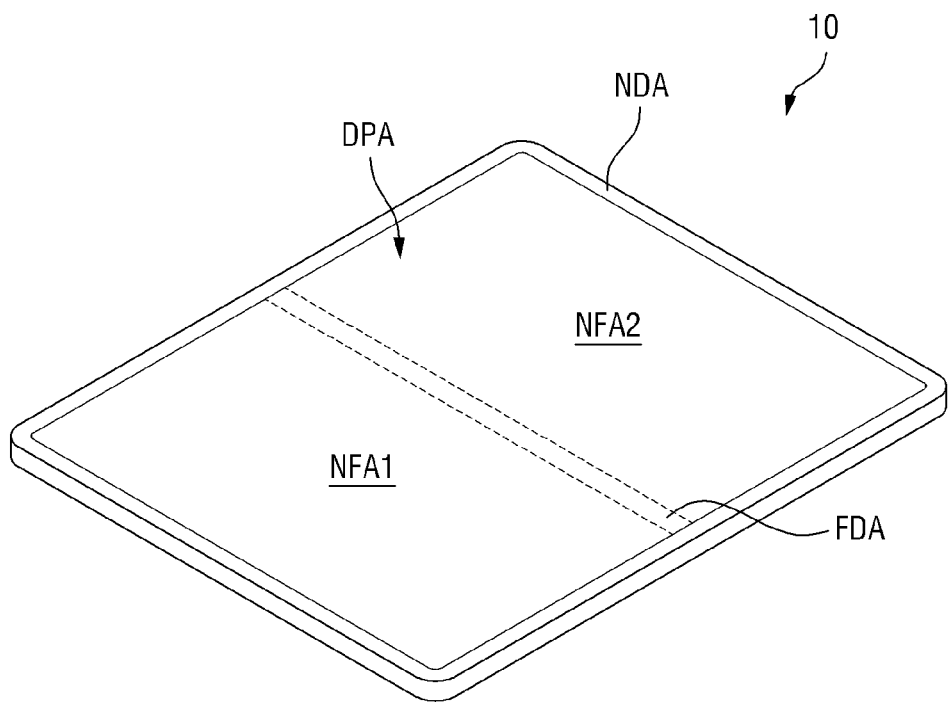
FIG. 1 is a perspective view of an embodiment of a display device.

The invention will now be described more fully hereinafter with reference to the accompanying drawings, in which embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. The same reference numbers indicate the same components throughout the specification. In the attached figures, the thickness of layers and regions is exaggerated for clarity.

It will also be understood that when a layer is referred to as being related to another element such as being "on" another layer or substrate, it can be directly on the other layer or substrate, or intervening layers may also be present. In contrast, when an element is referred to as being related to another element such as being "directly on" another element, there are no intervening elements present.

Although the terms "first," "second," etc. may be used herein to describe various elements, these elements should not be limited by these terms. These terms may be used to distinguish one element from another element. Thus, a first element discussed below may be termed a second element without departing from teachings of one or more exemplary embodiments. The description of an element as a "first" element may not require or imply the presence of a second element or other elements.

The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

A folding operation of a display device may apply stress to one or more layer within a stacked or laminated structure of the display device. If an adhesive layer involved in bonding of layers within the stacked structure is exposed to the stress, detachment of one or more of the layers may occur as a defective detachment.

Hereinafter, exemplary embodiments will be described with reference to the accompanying drawings.

Figure 2:
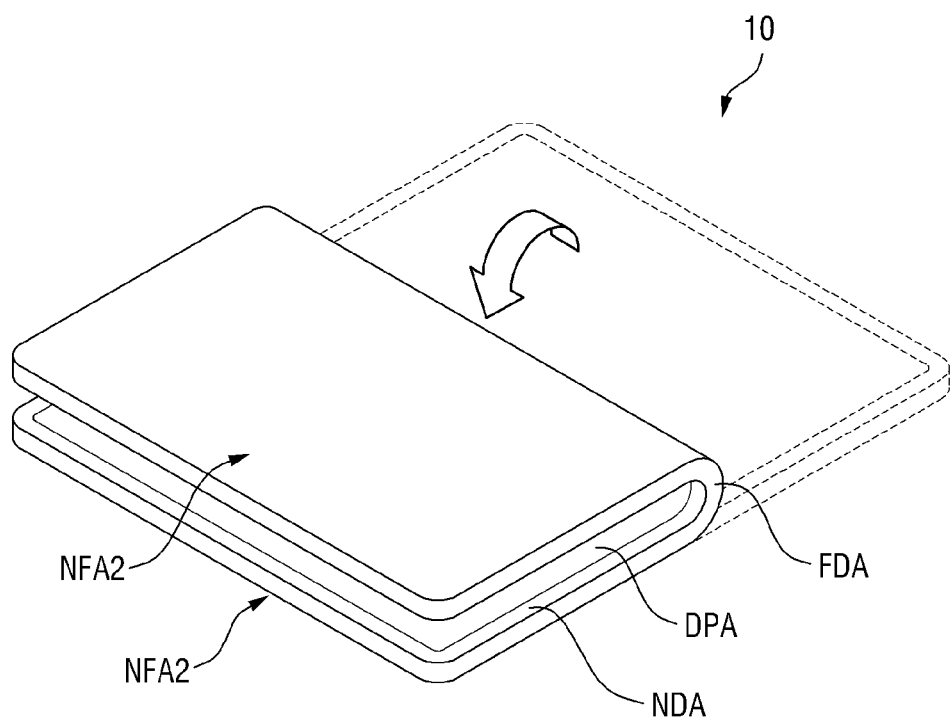
FIG. 2 is a perspective view of the display device of FIG. 1 which is folded.

FIG. 1 is a perspective view of an embodiment of a display device. FIG. 2 is a perspective view of the display device of FIG. 1 which is folded.

Referring to FIGS. 1 and 2, the display device 10 displays an image or a video at a display portion DPA. The display portion DPA may include various elements, components, devices, etc. with which the image or the video is displayed.

Examples of the display device 10 may include, but are not limited to, a smart phone, a mobile phone, a tablet personal computer ("PC"), a personal digital assistant ("PDA"), a portable multimedia player ("PMP"), a television, a game machine, a wristwatch-type electronic device, a head-mount display, a personal computer monitor, a laptop computer, a car navigation system, a car dashboard, a digital camera, a camcorder, an external billboard, an electronic billboard, various medical devices, various inspection devices, various household appliances which display an image or a video at a display portion DPA such as a refrigerator or a washing machine, physical electronic devices and/or everyday objects into which Internet connectivity is extended (e.g., Internet of Things devices), and the like. As a representative example of a foldable display device to be described later, a foldable smart phone, a tablet PC or a laptop computer may be mentioned, but the present disclosure is not limited thereto.

The display device 10 may have a substantially rectangular shape in a plan view. The display device 10 may have a rectangular shape having rounded edges or linear edges in a plan view. The display device 10 may include four sides or edges in the plan view. The display device 10 may include relatively long sides and relatively short sides.

Referring to FIG. 1, for example, the relatively long sides may extend in a first direction and the relatively short sides may extend along a second direction. The first direction and the second direction cross each other. The display device 10 which is flat (e.g., unfolded) may be disposed in a plane defined by the first direction and the second direction which cross each other. A third direction may cross each of the first direction and the second direction. A thickness of the display device 10 and/or components thereof may be defined along the third direction.

The display device 10 may include a first surface and a second surface which is opposite to the first surface. At least one of the first surface and the second surface of the display device 10 may be a display surface at which an image or a video is displayed. In one embodiment, the display surface is located at the first surface of the display device 10, and no image may be seen from or display at the second surface. In the following description, the above-mentioned embodiment will be mainly described. However, the display device 10 may be a double-sided display device in which images can be seen from and displayed at both the first surface and the second surface.

The display device 10 may be divided into the display portion DPA (e.g., display area DPA) for displaying an image or a video according to display on a plane, and a non-display portion NDA (e.g., non-display area NDA) disposed adjacent to the display portion DPA.

The display portion DPA may include a plurality of pixels. A pixel is a basic unit at which light is emitted and/or an image or video is displayed. The pixels may include, but are not limited to, a red pixel, a green pixel and a blue pixel, at which red, green and blue light are respectively emitted. The pixels may further include a white pixel at which white light is emitted. The plurality of pixels may be alternately arranged in a plan view within the display portion DPA. In an embodiment, for example, the pixels may be arranged in a matrix form, but the present disclosure is not limited thereto.

The non-display portion NDA may be disposed adjacent to the display portion DPA, such as being disposed around the display portion DPA. The non-display portion NDA may surround the display portion DPA in a plan view. In one embodiment, the display portion DPA may be provided or formed in a rectangular shape, and the non-display portion NDA may be disposed at each of four sides of the display portion DPA having the rectangular shape, but the present disclosure is not limited thereto. The non-display portion NDA may be provided with a black matrix to reduce or effectively prevent light emitted from adjacent pixels from leaking therebetween.

The display device 10 may be a foldable device. The term "foldable device" as used herein refers to a device capable of being folded and unfolded, as well as a folded device which remains folded (e.g., is not unfoldable). A foldable display device may be foldable at an angle between 0 degrees and about 180 degrees, but the present disclosure is not limited thereto. The display device 10 which is disposed flat is considered disposed at 0 degrees and may be foldable at a folding angle which is greater than or less than 180 degrees. In an embodiment, for example, the display device 10 may be foldable at a folding angle which equal to or greater than 90 degrees and less than 180 degrees, or equal to or greater than 120 degrees and less than 180 degrees, relative to the 0 degrees. In addition, the folded state may refer to a state where it is folded out of the unfolded state even though complete folding is not performed.

A display device 10 which is folded may form a radius of curvature at an end portion of the display device 10. The radius of curvature (see 'R' in FIG. 4) for the display device 10 which is folded may be about 5 millimeters (mm) or less. In an embodiment, the radius of curvature may be in a range of about 1 mm to about 2 mm, or about 1.5 mm, but the present disclosure is not limited thereto.

The display device 10 and various layers thereof may be foldable or bendable at a folding area FDA (e.g., bending area FDA) with respect to a folding axis. The folding axis and/or a length of the folding area FDA may linearly extend in one direction in a plan view. Although a case where the folding axis and the length of the folding area FDA extends in parallel to the relatively short side of the display device 10 has been illustrated as an example, the present disclosure is not limited thereto. In embodiments, the folding axis and/or a length of the folding area FDA may be parallel to the relatively long side or may be inclined with respect to both of the relatively short side and the relatively long side.

In one embodiment, the folding area FDA of the display device 10 may be determined at a specific position along the display device 10. The number of folding areas FDA determined at a specific position in the display device 10 may be one, or two or more. In another embodiment, the position of the folding area FDA is not specified in the display device 10 and may be freely set or provided in various areas.

With respect to the folding area FDA, the display device 10 may be divided into a first non-folding area NFA1 (e.g., first non-bending area NFA1) and a second non-folding area NFA2 (e.g., second non-bending area NFA2). The first non-folding area NFA1 may be located on a first side of the folding area FDA and the second non-folding area NFA2 may be located on a second side of the folding area FDA which is opposite to the first side. When the folding area FDA is defined at a specific position, the first non-folding area NFA1 and the second non-folding area NFA2 may be specified as areas where folding is not performed, e.g., where the display device 10 is not foldable or bendable and remains flat.

The first non-folding area NFA1 and the second non-folding area NFA2 may have a same width to define same planar areas thereof, but the present disclosure is not limited thereto. If the folding area FDA is not specified, the first non-folding area NFA1 and the second non-folding area NFA2 may have different planar areas depending on the position where the folding area FDA is set.

The display portion DPA of the display device 10 may be disposed corresponding to both the first non-folding area NFA1 and the second non-folding area NFA2. Further, the display portion DPA may be located at the folding area FDA corresponding to a boundary between the first non-folding area NFA1 and the second non-folding area NFA2. That is, the display portion DPA of the display device 10 may be arranged continuously regardless of boundary of the non-folding areas NFA1 and NFA2, the folding area FDA and the like. That is, the display portion DPA in one area among the non-folding areas NFA1 and NFA2 and the folding area FDA, may extend therefrom to be disposed in another area among the non-folding areas NFA1 and NFA2 and the folding area FDA. However, the present disclosure is not limited thereto. In embodiments, the display portion DPA may be disposed in the first non-folding area NFA1, but the display portion DPA may not be disposed in the second non-folding area NFA2. In other embodiments, the display portion DPA may be disposed in the first non-folding area NFA1 and the second non-folding area NFA2, but the non-display portion NDA may not be disposed on the folding area FDA. That is, an image or a video may be displayable at various areas among the non-folding areas NFA1 and NFA2 and the folding area FDA.

Figure 12:
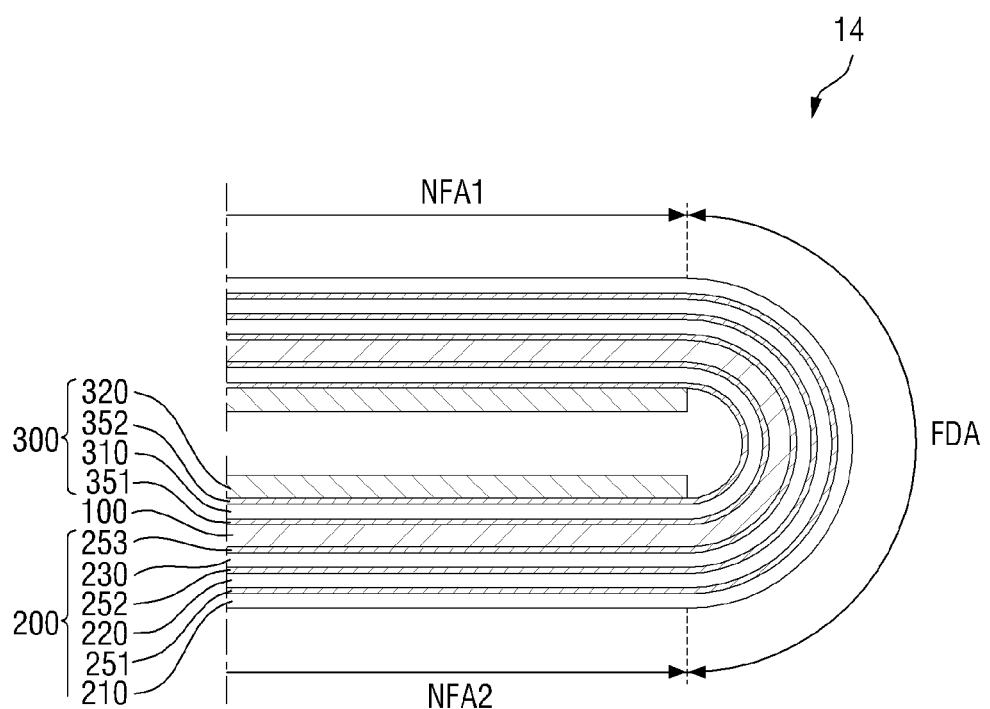
FIG. 12 is an enlarged cross-sectional view of a modified embodiment of a display device.

The display device 10 may be folded by an in-folding method in which the display surface is folded inward such that portions of the display surface face each other along a thickness direction of the display device 10 (exemplified in FIG. 2), or an out-folding method in which the display surface is folded outward such that portions of the display surface face in opposite directions to each other along the thickness direction of the display device 10 (exemplified in FIG. 12). The display device 10 may be folded by only one of the in-folding method and the out-folding method. Alternatively, both in-folding and out-folding may be performed for a same display device 10. In the case of the display device 10 in which both in-folding and out-folding are performed, in-folding and out-folding may be performed based on the same folding area FDA. Alternatively, the display device 10 may include a plurality of folding areas FDA, at which different folding methods are performed, such as a folding area dedicated to in-folding and a folding area dedicated to out-folding.

In one embodiment, the display device 10 may be foldable by folding all of the components and/or members of the display device 10, such as a display panel or a layer, a panel and/or a substrate laminated thereon, which each have flexibility. In some embodiments, a portion of the display panel and/or the members laminated thereon may have a separate shape with respect to the folding area FDA. In this case, the separate member located in the non-folding area may not have flexibility.

Figure 3:
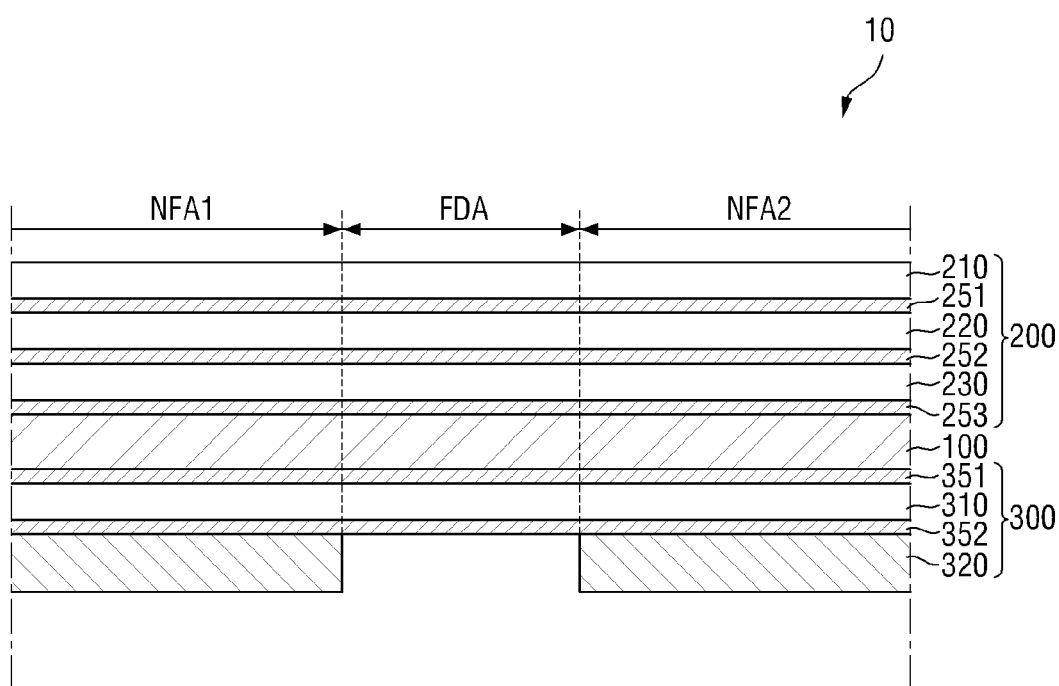
FIG. 3 is an enlarged cross-sectional view of an embodiment of a display device which is flat (e.g., unfolded)
Figure 4:
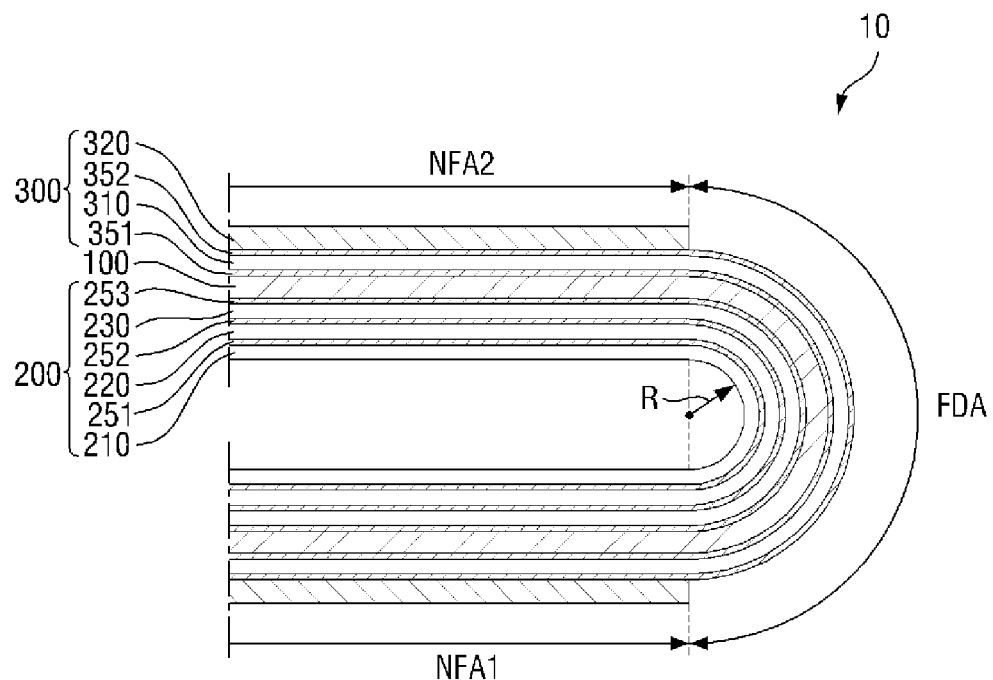
FIG. 4 is an enlarged cross-sectional view of an embodiment of the display device of FIG. 3 which is folded.

FIG. 3 is an enlarged cross-sectional view showing an embodiment of a display device which is flat (e.g., un-bent at the folding area). FIG. 4 is an enlarged cross-sectional view of an embodiment of an end portion of the display device in FIG. 3 which is bent at the folding area. In FIGS. 3 and 4, a vertical direction may represent a thickness direction of the display device 10 and/or components thereof.

Referring to FIGS. 3 and 4, the display device 10 may include a display panel 100, a front laminated structure 200 stacked on the front side or a front surface of the display panel 100 and a rear laminated structure 300 stacked on the rear side or a rear surface of the display panel 100. The laminated structures 200 and 300 may include at least one bonding member with which layers are attachable to each other. Here, the front side of the display panel 100 refers to a direction in which the display panel 100 displays an image or a video, e.g., a viewing side of the display device 10 or a side at which the display screen thereof is disposed, and the rear side of the display panel 100 is opposite to the front side along a thickness direction of the display device 10. A front surface of the display panel 100 is located at the front side, and a rear surface of the display panel 100 is located at the rear side.

The display panel 100 displays an image or a video at a display screen thereof. Examples of the panel may include a light-receiving display panel such as a liquid crystal display ("LCD") panel and an electrophoretic display ("EPD") panel, as well as a self-luminous display panel such as an organic light emitting diode ("OLED") panel, an inorganic electroluminescent ("EL") display panel, a quantum dot light emitting display ("QLED") panel, a micro-LED display panel, a nano-LED display panel, a plasma display panel ("PDP"), a field emission display ("FED") panel, a cathode ray tube ("CRT") display panel, and the like. Hereinafter, an organic light emitting display panel will be described as an example of the display panel 100. Unless special distinction is necessary, the organic light emitting display panel applied to the embodiment will be simply referred to as the display panel 100. However, the embodiment is not limited to the organic light emitting display panel, and other display panels 100 enumerated above or known in the art may be applied within the scope of the present disclosure.

The display panel 100 may further include a touch member. The touch member may be provided as a separate panel or film from the display panel 100 and subsequently attached to the display panel 100, but may be provided in the form of a touch layer inside the display panel 100. In the following embodiment, a case where the touch member is provided inside the display panel 100 and included in the display panel 100 will be described as an example, but the present disclosure is not limited thereto.

Figure 5:
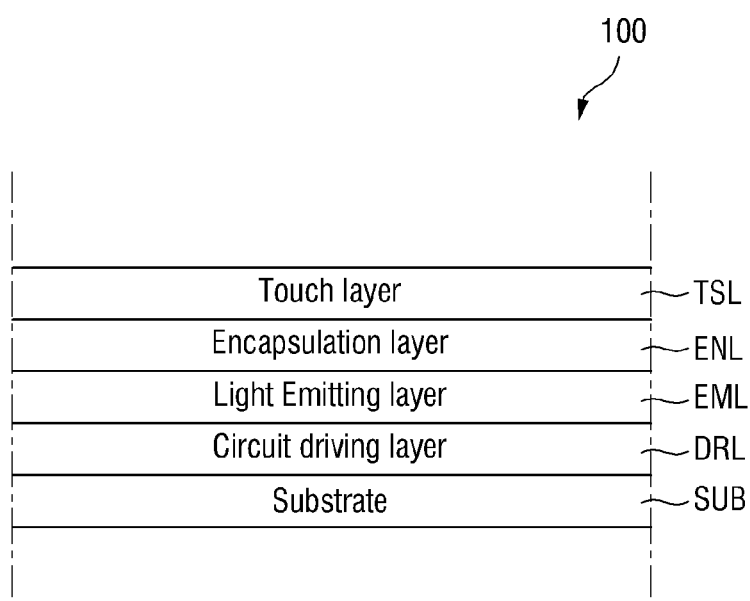
FIG. 5 is an enlarged cross-sectional view of an embodiment of a display panel.

FIG. 5 is an enlarged cross-sectional view of an embodiment of a display panel. Referring to FIG. 5, the display panel 100 may include a substrate SUB, a circuit driving layer DRL on the substrate SUB, a light emitting layer EML on the circuit driving layer DRL, an encapsulation layer ENL on the light emitting layer EML, and a touch layer TSL on the encapsulation layer ENL. The display panel 100 may include a plurality of pixels corresponding to those pixels described above.

The substrate SUB may be a flexible substrate including a flexible polymer material such as polyimide or the like. Accordingly, the display panel 100 is bendable, rollable or foldable. The front laminated structure 200 and the rear laminated structure 300 which are each attached to the display panel 100, may be bendable, rollable or foldable together with the display panel 100. In some embodiments, the substrate SUB may include a plurality of sub-substrates superimposed along a thickness direction with a barrier layer interposed therebetween. In this case, each sub-substrate may be flexible. The substrate SUB may form an outer surface of the display panel 100, without being limited thereto.

The circuit driving layer DRL may be disposed on the substrate SUB. The circuit driving layer DRL may include a circuit with which the pixels are driven to generate light, emit light, display an image, display a video, etc. The circuit driving layer DRL may include a plurality of thin film transistors.

The light emitting layer EML may be disposed on the circuit driving layer DRL. The light emitting layer EML may be connected to the circuit driving layer DRL and be driven thereby to generate and/or emit light. The light emitting layer EML may include an organic light emitting layer. The light emitting layer EML may emit light with various luminance levels according to a driving signal transmitted from the circuit driving layer DRL connected to the light emitting layer EML.

The encapsulation layer ENL may be disposed on the light emitting layer EML. The encapsulation layer ENL may include an inorganic film, or a laminated film of an inorganic film and an organic film.

The touch layer TSL may be disposed on the encapsulation layer ENL. The touch layer TSL, as a layer which recognizes a touch input, may perform a function of a touch member. The touch layer TSL may include a plurality of sensing regions and sensing electrodes with which the touch input is sensed by the touch layer TSL. The touch layer TSL may form an outer surface of the display panel 100, without being limited thereto.

Referring again to FIGS. 3 and 4, the front laminated structure 200 is disposed on the front side of the display panel 100. The front laminated structure 200 may include a polarizing member 230, a cover window 220 and a cover window protective layer 210 that are sequentially stacked from the display panel 100.

The polarizing member 230 polarizes the transmitted light. The polarizing member 230 may serve to reduce reflection of external light incident to the display device 10 from outside thereof. In one embodiment, the polarizing member 230 may be a polarizing film. The polarizing film may include a polarizing layer and protective layers sandwiching the polarizing layer therebetween from above and below. The polarizing layer may include a polyvinyl alcohol film. The polarizing layer can be a layer which is stretched in one direction. The stretching direction of the polarizing layer may be an absorption axis, and a direction perpendicular thereto may be a transmission axis. The protective layers may be disposed on one surface and the other surface of the polarizing layer, respectively. The protective layers may include or be made of cellulose resin such as triacetyl cellulose or polyester resin, but the present disclosure is not limited thereto.

The cover window 220 may be disposed on the front side of the polarizing member 230. The cover window 220 serves to protect the display panel 100. The cover window 220 may include or be made of a transparent material. The cover window 220 may include, for example, glass or plastic.

When the cover window 220 includes glass, the glass may be ultra-thin glass ("UTG") or thin glass. When the glass includes or is made of ultra-thin glass or thin glass, the cover window 220 may have flexibility to be bent, folded and rolled. A thickness of the glass may be, for example, in a range of about 10 micrometers (μm) to about 300 μm, particularly, 30 μm to 80 μm or about 50 μm. The glass of the cover window 220 may include soda lime glass, alkali aluminosilicate glass, borosilicate glass, or lithium aluminosilicate glass. The glass of the cover window 220 may include chemically or thermally strengthened glass to have a relatively stronger strength compared to that of non-strengthened glass. The chemical strengthening can be performed through an ion exchange treatment process in an alkali salt. The ion exchange treatment process may be performed two or more times.

When the cover window 220 includes plastic, the cover window 220 may have flexibility to be bent, folded and rolled. Examples of plastics applicable to the cover window 220 include, but are not limited to, polyimide, polyacrylate, polymethylmethacrylate ("PMMA"), polycarbonate ("PC"), polyethylene naphthalate ("PEN"), polyvinylidene chloride, polyvinylidene difluoride ("PVDF"), polystyrene, ethylene vinylalcohol copolymer, polyethersulfone ("PES"), polyetherimide ("PEI"), polyphenylene sulfide ("PPS"), polyallylate, triacetyl cellulose ("TAC"), cellulose acetate propionate ("CAP"), and the like. The cover window 220 may include one or more of the plastic materials listed above.

The cover window protective layer 210 may be disposed on the front side of the cover window 220. The cover window protective layer 210 may form an outer surface of the display device 10, without being limited thereto. The cover window protective layer 210 may provide for the cover window 220 various functions such as shattering prevention, shock absorption, stamping prevention, fingerprint prevention and glare prevention. The cover window protective layer 210 may include a transparent polymer film. The transparent polymer film may include at least one of polyethylene terephthalate ("PET"), polyethylene naphthalate ("PEN"), polyethersulfone ("PES"), polyimide ("PI"), polyarylate ("PAR"), polycarbonate ("PC"), polymethyl methacrylate ("PMMA"), or cycloolefin copolymer ("COC") resins.

The front laminated structure 200 may include front bonding members 251-253 to bond adjacent laminated members or layers to each other. As shown in FIG. 3, the front bonding members 251-253 may be continuous between the first non-folding area NFA1 and the second non-folding area NFA2 by extending across the folding area FDA.

Referring to FIGS. 3 and 4, for example, as the front bonding members 251-253, a first bonding member 251 may be disposed between the cover window 220 and the cover window protective layer 210, a second bonding member 252 may be disposed between the cover window 220 and the polarizing member 230, and a third bonding member 253 (e.g., a polarizing member bonding member) may be disposed between the polarizing member 230 and the display panel 100. That is, the front bonding members 251-253 are members with which various functional layers of the display device 10 are attached to the front surface of the display panel 100. The first bonding member 251 may be a protective layer bonding member for attaching the cover window protective layer 210 to other functional layers, the second bonding member 252 may be a window bonding member for attaching the cover window 220 to other functional layers, and the third bonding member 253 may be a polarization unit bonding member for attaching the polarizing member 230 to other functional layers. All of the front bonding members 251-253 may be optically transparent.

The rear laminated structure 300 is disposed on the rear side of the display panel 100. The rear laminated structure 300 may include a polymer film layer 310 and a heat dissipation member 320 sequentially stacked from the display panel 100.

The polymer film layer 310 may include a polymer film. The polymer film layer 310 may include, for example, polyimide ("PI"), polyethylene terephthalate ("PET"), polycarbonate ("PC"), polyethylene ("PE"), polypropylene ("PP"), polysulfone ("PSF"), polymethylmethacrylate ("PMMA"), triacetylcellulose ("TAC"), cycloolefin polymer ("COP"), and the like. The polymer film layer 310 may include a functional layer. The functional layer may include, for example, a light absorbing layer. The light absorbing layer may include a light absorbing material such as a black pigment or a dye. The light absorbing layer may be provided or formed on the polymer film by a coating or printing method using black ink.

The heat dissipation member 320 may be disposed on the rear side of the polymer film layer 310. The heat dissipation member 320 serves to diffuse heat generated in the display panel 100 and other components of the display device 10, to outside the display device 10. The heat dissipation member 320 may include a metal plate. The metal plate may include a metal having excellent thermal conductivity, such as copper, silver and the like. The heat dissipation member 320 may be a heat dissipation sheet including graphite, carbon nanotubes, or the like.

The heat dissipation member 320 may be disconnected at the folding area FDA to facilitate folding of the display device 10 as shown in FIGS. 3 and 4, although not limited thereto. In an embodiment, for example, a first metal plate may be disposed corresponding to the first non-folding area NFA1 and a second metal plate may be disposed corresponding to the second non-folding area NFA2. The first metal plate and the second metal plate may be portions of the heat dissipation member 320 which are disconnected from each other at the folding area FDA. The first metal plate and the second metal plate may be physically spaced apart from each other by a dimension of the folding area FDA. The heat dissipation member 320 may form an outer surface of the display device 10, without being limited thereto.

The rear laminated structure 300 may include rear bonding members 351-352 to bond adjacent laminated members to each other. Referring to FIGS. 3 and 4, for example, a fourth bonding member 351 may be disposed between the display panel 100 and the polymer film layer 310, and a fifth bonding member 352 (e.g., a heat dissipation member bonding member) may be disposed between the polymer film layer 310 and the heat dissipation member 320. That is, the rear bonding members 351-352 are members with which various functional layers of the display device 10 are attached to the rear surface of the display panel 100. The fourth bonding member 351 may be a polymer film bonding member for attaching the polymer film layer 310 to other functional layers, and the fifth bonding member 352 may be a heat dissipation member bonding member for attaching the heat dissipation member 320 to other functional layers. When the heat dissipation member 320 is disconnected at the folding area FDA, the fifth bonding member 352 may also be disconnected at the folding area FDA to correspond to separated portions of the heat dissipation member 320, without being limited thereto. However, as shown in FIG. 3, the fifth bonding member 352 may be continuous between the first non-folding area NFA1 and the second non-folding area NFA2 by extending across the folding area FDA.

When the display device 10 displays an image only on the front surface, the rear bonding members 351-352 may not be optically transparent, unlike the front bonding members 251-253 which are optically transparent for transmitting the image therethrough to a viewing side of the display device 10.

Each of the front bonding members 251-253 and the rear bonding members 351-352 described above may include an adhesive material. Each bonding member may include a pressure-sensitive adhesive layer. Each of the bonding members may have the same composition, but may have a different composition depending on a position of a bonding member along a thickness and/or planar direction of the display device 10 and/or an object to be bonded relative to another object or layer.

Some of the front bonding members 251-253 may include an optically transparent adhesive layer or optically transparent resin. In an embodiment, for example, the second bonding member 252 for bonding the cover window 220 to the display panel 100 may include an optically transparent adhesive layer or optically transparent resin. However, the present disclosure is not limited thereto.

Each of the first to fifth bonding members 251-253 and 351-352 may have a thickness of about 300 μm or less. In one embodiment, the thickness of each of the first to fifth bonding members 251-253 and 351-352 may be about 200 μm or less, and one or more of the bonding members 251-253 and 351-352 may have a thickness of about 100 μm or less. The lower limit of the thickness of the bonding members 251-253 and 351-352 is not limited, but may be about 10 μm or more, such as about 50 μm or more, in order to exhibit the minimum adhesive force.

Each of the bonding members 251-253 and 351-352 may include or be formed of a single adhesive layer, a plurality of laminated adhesive layers, or adhesive layers on various surfaces (e.g., opposing surfaces) of a base layer or member, respectively, similarly to a structure of a double-sided tape.

In some embodiments, the bonding members 251-253 and 351-352 may include a silicone-based adhesive. The silicone-based adhesive may include a siloxane resin. Specifically, the silicone-based adhesive may include silicone gum containing a polyorganosiloxane compound. The silicone gum may include a crosslinkable functional group such as a black vinyl group. The silicone-based adhesive may further include an MQ resin having a three-dimensional netlike molecular structure including monofunctional siloxane units and tetrafunctional siloxane units. The silicone-based adhesive may further include an additive including at least one of a borane compound and a borate compound.

In some embodiments, the bonding members 251-253 and 351-352 may include an acrylic adhesive. The acrylic adhesive may include an acrylic polymer. The acrylic polymer may be obtained by polymerizing an acrylic monomer, and may be a main material of an acrylic polymer. Examples of the acrylic monomer may include ethyl acrylate, n-butyl acrylate, t-butyl acrylate, isobutyl acrylate, n-hexyl acrylate, 2-ethylhexyl acrylate, n-octyl acrylate, isooctyl acrylate, n-nonyl acrylate, isononyl acrylate, n-decyl acrylate, isodecyl acrylate, n-dodecyl acrylate, n-tridecyl acrylate, n-tetradecyl acrylate, 2(2-ethoxyethoxy) ethyl acrylate, 2-hydroxyethyl acrylate, 2-hydroxypropyl acrylate, 3-hydroxypropyl acrylate, 2-hydroxybutyl acrylate, 4-hydroxybutyl acrylate, 6-hydroxyhexyl acrylate, 8-hydroxyoctyl acrylate, 10-hydroxydecyl acrylate, 12-hydroxy lauryl acrylate, [4-(hydroxymethyl)cyclohexyl]methyl acrylate and the like. The acrylic adhesive may further include, in addition to the acrylic polymer, an azo-based initiator such as 2,2'-azobisisobutyronitrile, a filler such as silica or zirconia, a crosslinking agent, an antistatic agent such as poly(ethylenedioxythiophene) polystyrene sulfonate ("PEDOT:PSS") and the like.

In one embodiment, the acrylic adhesive may be prepared by mixing about 120 parts by weight to about 250 parts by weight of the acrylic monomer with a solvent and heating the mixture with stirring, then adding about 0.1 to about 1 part by weight of an azo-based initiator, about 0.5 to about 1 part by weight of a filler, about 1.5 to about 2.5 parts by weight of a crosslinking agent, and about 0.5 to about 1 part by weight of an antistatic agent to the solution, and then heating with stirring.

In some other embodiments, the bonding members 251-253 and 351-352 may include a crystalline polymer and a rubber-based polymer. The crystalline polymer may be selected from polypropylene, syndiotatic polystyrene, polyamide, polycaprolactone, polycarbonate-diol, polyethylene terephthalate ("PET"), polyphenylene sulfide, polybutylene terephthalate ("PBT"), polyarylate ("PAR"), poly(DPAA), polyether imide ("PEI"), polyacetal, polyoxymethylene ("POM") and the like.

The rubber-based polymer may be polybutadiene, polyisoprene, polyneoprene, polyisobutylene, cellulose acetate, polyvinyl acetate or a copolymer thereof. The weight ratio of the crystalline polymer to the rubber-based polymer may be about 1:0.3 or more and about 1:1.5 or less. Further, the bonding member may further include a carbamic acid ester-based polymer, an ester-based polymer and/or a (meth) acrylic acid ester-based polymer, and may further include a coupling agent such as a silane-based coupling agent, a titanate-based coupling agent and a chromium-based coupling agent, an adhesion promoter such as rosin resin, rosin ester resin, terpene phenol resin and terpene resin, a yellowing inhibitor, an antioxidant or the like.

The constituent materials and compositions of the bonding members 251-253 and 351-352 are not limited to those exemplified above and other configurations or compositions of adhesive materials known in the art can be applied.

The front bonding members 251-253 and the rear bonding members 351-352 may have adhesive properties such as specific modulus, creep characteristic, peel force and the like. Among them, the modulus and creep characteristic are related to the deformation and restoration of the pressure applied to the bonding member, and the peel force is related to the adhesive force of the bonding member. However, since the bonding members 251-253 and 351-352 are exposed to different stress conditions depending on their positions within the stack of layers relative to a middle layer and/or the display panel 100, different adhesive properties may be required for bonding members at different positions within the display device 10.

Specifically, when the display device 10 having the above-described laminated structure is folded or bent, the layers constituting the display device 10 may receive different stresses. In an embodiment, for example, when the display device 10 is in-folded by which the display surface is folded inward and portions thereof face each other, the layers of the display device 10 which are closer to the display surface of the display device 10 may be subjected to compressive stress, and the layers of the display device 10 which are closer to the rear surface of the display device 10 may be subjected to tensile stress. The compressive stress becomes maximum at the first surface (e.g., a display surface) of the display device 10, and may decrease along the thickness direction from the first surface toward the second surface (e.g., rear surface) of the display device 10. The tensile stress becomes maximum at the second surface of the display device 10, and may decrease along the thickness direction from the second surface toward the first surface of the display device 10.

The stress neutral plane at which the compressive stress and the tensile stress are balanced (e.g., both the values of compressive stress and tensile stress are 0) may be located in a middle portion of the display device 10 which is taken along the thickness direction. In an embodiment, for example, the stress neutral plane may be designed to be disposed within the display panel 100 located between the front laminated structure 200 and the rear laminated structure 300 along the thickness direction. In this case, in the display device 10 which is in-folded exposes the front laminated structure 200 located on the front side of the display panel 100 to compressive stress, and exposes the rear laminated structure 300 located on the rear side of the display panel 100 to tensile stress.

Since the bonding members 251-253 and 351-352 of the display device 10 are exposed to various stresses during the folding operation, adhesive properties of the bonding members 251-253 and 351-352 are defined in order to maintain the adhesive force thereof, even in repeated folding operations of the display device 10, and to have a restoring force when a compressive stress and/or a tensile stress are respectively removed therefrom.

Specifically, the average modulus (average of the moduli of the bonding members within the front laminated structure 200) of the front bonding members 251-253 may be smaller than the average modulus (average of the moduli of the bonding members within the rear laminated structure 300) of the rear bonding members 351-352. Here, the modulus of the bonding member is expressed as a ratio of stress to strain (e.g., elastic modulus or modulus of elasticity or indentation modulus). It may mean that the smaller the modulus, the larger the deformation at the same stress. In an embodiment where the display device 10 is in-folded to subject the front bonding members 251-253 to the compressive stress, the bonding members within the front laminated structure 200 may have a relatively small modulus to reduced or effectively prevent defective detachment due to compressive stress. On the other hand, where the display device 10 is in-folded to subject the rear bonding members 351-352 to the tensile stress, the bonding members within the rear laminated structure 300 may have a relatively high restoration ratio in order to return such bonding member to an original state after folding thereof. To this end, the bonding members within the rear laminated structure 300 may have a relatively high modulus.

Among the front bonding members 251-253, the first bonding member 251 and the second bonding member 252, which are relatively far from the display panel 100 as compared to the third bonding member 253, receive a relatively large compressive stress, but the third bonding member 253, which is disposed immediately adjacent to the display panel 100, receives a relatively small compressive stress. Thus, the first and second bonding members 251 and 252 have a relatively small modulus, but the third bonding member 253 may have a relatively large modulus in order to have a sufficient restoration ratio.

From this point of view, the modulus of each of the first bonding member 251 and the second bonding member 252, which are relatively low-modulus layers, may be less than or equal to about 1 megapascal (MPa). In an embodiment, for example, the modulus of each of the first bonding member 251 and the second bonding member 252 may be about 50 kilopascal (KPa) to about 1 MPa. If the modulus of each of the first bonding member 251 and the second bonding member 252 is about 1 MPa or less, deformation is more easily achieved even by the compressive stress, and defective detachment due to compressive stress may be reduced or effectively prevented even when the folding operation is repeated thousands or more times (for example, about 200,000 times). In embodiments, the modulus of the first bonding member 251 and the second bonding member 252 are about 50 KPa or more for returning such members to an original state or shape thereof, even when unfolding the members with a minimum restoring force.

The modulus of the first bonding member 251 may be different from the modulus of the second bonding member 252. In one embodiment, the first bonding member 251, which is subjected to a relatively greater compressive stress, may have a smaller modulus than the second bonding member 252. The magnitude of the modulus of the second bonding member 252 may be about 1.1 to about 2 times the magnitude of the modulus of the first bonding member 251. However, a magnitude relationship between the modulus of the first bonding member 251 and the modulus of the second bonding member 252 is not limited to the above case. In an embodiment, for example, the modulus of the first bonding member 251 may be equal to or greater than the modulus of the second bonding member 252.

The modulus of each of the third bonding member 253, the fourth bonding member 351 and the fifth bonding member 352, which are relatively high-modulus layers, may be about 100 KPa to about 10 MPa, such as about 1 MPa to about 10 MPa. The modulus of the third to fifth bonding members 253, 351 and 352 may be at least 2 times and at most 20 times the modulus of the first and second bonding members 251 and 252, and may be in a range of about 3 to about 8 times in some embodiments.

The fifth bonding member 352 within to the rear laminated structure 300 may have a greater modulus than the fourth bonding member 351 within to the rear laminated structure 300 and located closer to the display panel 100 than the fifth bonding member 352 (e.g., more inward). Further, the third bonding member 253 within to the front laminated structure 200 may have a greater modulus than the fourth bonding member 351 within to the rear laminated structure 300. The third bonding member 253 for attaching the polarizing member 230 and the fifth bonding member 352 located at the rearmost position of the stacked structure of the display device 10 may have substantially the same modulus, but the present disclosure is not limited thereto.

The modulus of the bonding members 251-253 and 351-352 may be a modulus value obtained by measuring a respective bonding member in the form of a thin film, where the thin film is defined as having a thickness of about 300 μm or less, about 200 μm or less, or about 100 μm or less. Further, the modulus of the bonding members 251-253 and 351-352 may be a value obtained by measuring a respective bonding member outside of the stacked structure of the display device 10. In an embodiment, the modulus for the bonding member as a thin film may be measured by an indenter such as a bio-indenter or a nano-indenter such as those of the company Anton-Paar GmbH. That is, the modulus of the bonding member as a thin film may be measured by an indenter evaluation method. Such measured modulus may be defined as an indenter-measured value.

In general, a rheometer used to measure the modulus of an adhesive material cannot perform measurement for an adhesive layer having a thickness of about 500 μm or less. Alternatively, the modulus value may be measured with the adhesive material in a bulk state or after a plurality of adhesive layers of the adhesive material are laminated and total thickness is set to about 500 μm or more or about 700 μm or more. However, the modulus value obtained by measuring the bulk state of an adhesive material or a plurality of adhesive layers of the adhesive material may be different from the modulus value obtained by measuring the adhesive material as a thin film which is the form actually used within the stacked structure of the display device 10. Particularly, when a heat treatment process or the like is performed during a lamination process to form a stacked structure (e.g., laminated structure) of the display device 10, the modulus of the adhesive material may be varied. The degree of variation may also vary depending on process variables. Therefore, determining the modulus of the bonding member applied in the display device 10 only with the modulus measured from adhesive material in the bulk state may be difficult, and therefore matching the modulus to a particular bonding member within in the display device 10 may also be difficult.

On the other hand, in the case of an indenter, measuring the modulus of a thin film having a thickness of about 1 μm or less as well as a thin film having a thickness of about 500 μm or less is possible. Therefore, through the measurement an adhesive layer in a thin film state or reverse engineering, a modulus of various ones of the bonding members 251-253 and 351-352 of the display device 10 may be accurately measured after the bonding members 251-253 and 351-352 are respectively separated from the display device 10, to respectively define a separated bonding member. In an embodiment, for example, liquid nitrogen may be used to extract a respective bonding member among the bonding members 251-253 and 351-352 from a laminated structure of the display device 10, and the modulus for the respective bonding member which has been extracted may be accurately measured using the indenter as describe above. The measured modulus may be referred to as an actual modulus of the bonding members 251-253 and 351-352.

By controlling the actual modulus of the bonding members 251-253 and 351-352 as described above, through the measured values, precisely managing the adhesive properties such as defective detachment prevention, restoring force, peel force and the like for each position of the bonding members 251-253 and 351-352 included in the display device 10 is possible. In an embodiment, for example, when the measured modulus value exceeds an above-mentioned range, a defect is determined such that further action can be taken and the adhesive properties of a non-defective product can be maintained. Further, a defect rate may be further reduced by deriving the modulus value of the bonding members 251-253 and 351-352 based on the measured values and adjusting such modulus value accordingly. The adhesive properties of the adhesive material which forms the bonding members 251-253 and 351-352 can be adjusted by process parameters such as types of constituent materials, a mixing ratio, a heat treatment temperature and/or ultraviolet ray exposure. Since a specific method of providing adhesive properties of an adhesive material is widely known in the art, a further description thereof will be omitted.

The creep characteristic or creep value of an adhesive material (e.g., otherwise referred to as 'creep'), which is another adhesive property, is generally proportional to the viscosity. The creep characteristic of each of the first to fifth bonding members 251-253 and 351-352 may be in a range of about 30% to about 70%. If the creep characteristic is less than about 30%, a respective bonding member may not be sufficiently deformed during the folding operation of the display device 10, and if the creep characteristic exceeds about 70%, the restoring force of the respective bonding member may become insufficient.

In one embodiment, among the front bonding members 251-253, the first bonding member 251 may have a larger creep characteristic than the second bonding member 252 and the third bonding member 253. Among the rear bonding members 351-352, the fourth bonding member 351 may have a larger creep characteristic than the fifth bonding member 352. The creep characteristics of the first bonding member 251 and the fourth bonding member 351 may range from about 60% to 70%, and the creep characteristics of the second bonding member 252, the third bonding member 253 and the fifth bonding member 352 may range from 40% to 50%, but the present disclosure is not limited thereto.

The creep characteristics described above can also be measured by using the indenter described above, for a respective bonding member having a thin film form or being separated from the display device 10 as described above. The values of the creep characteristics of an adhesive material as the thin film or after the bonding members 251-253 and 351-352 applied to the display device 10 are separated from the display device 10, may be in the range of about 30% to about 70% as described above.

The peel force of each of the first to fifth bonding members 251-253 and 351-352 may have a value of about 200 gram-force per inch (gf/inch) or more when peeled off at a peeling angle of about 180° at a speed of about 300 millimeters per minute (mm/min) in a tensile tester such as a universal testing machine ("UTM").

Hereinafter, a method of measuring the modulus and creep characteristics by an indenter will be described.

Figure 6:
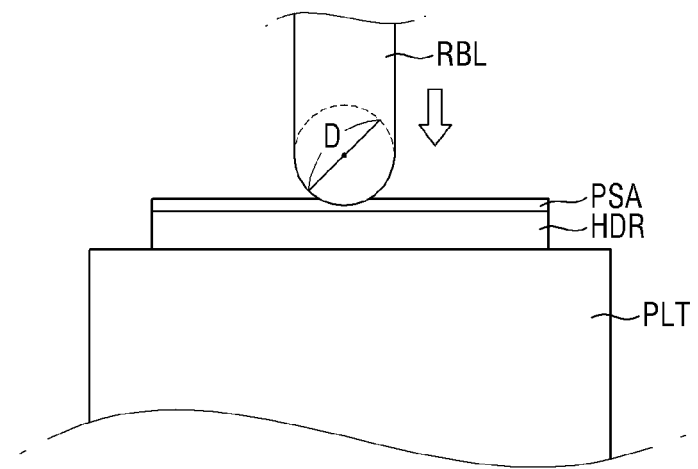
FIG. 6 is a cross-sectional view showing an embodiment of a method of measuring a modulus and a creep characteristic of an adhesive layer.

FIG. 6 is a cross-sectional view showing an embodiment of a method of measuring a modulus and a creep characteristic of an adhesive layer by using a bio-indenter.

Referring to FIG. 6, the bio-indenter includes an indenter RBL. The indenter RBL may have a ruby ball shape or a shape as a portion of a ball. A diameter D of the indenter RBL having the ball shape may be 1 about mm, but is not limited thereto.

In an exemplary embodiment, an adhesive layer PSA to be measured is provided as a size of about 2 centimeters (cm)×about 2 cm. The adhesive layer PSA is attached to a flat holder HDR for measurement. The adhesive layer PSA may represent a layer for forming any one of the bonding members 251-253 and 351-352 described above. If a release film is attached to the adhesive layer PSA, the release film is removed and attached to the flat holder HDR which is provided on a plate PLT. Subsequently, the adhesive layer PSA is pressed at a surface thereof, by the indenter RBL at a maximum load of about 0.2 millinewton (mN), and the pressed state is maintained for about 120 seconds. Here, a loading/unloading speed, e.g., a pressing speed, of the indenter RBL relative to the adhesive layer PSA, may be about 1.2 millinewtons per minute (mN/min). The depth of indentation formed during the pressing is measured. The indentation test by the indenter RBL of the bio-indenter is performed at a plurality of points, e.g., 15 points for one sample, and the indentation depth of the sample can be expressed as an average value of the test results of the plurality of times.

In an embodiment, an indentation depth measuring process may include a loading process in which a load is applied to an indenter RBL while the indenter RBL is being pressed to an adhesive layer in a thin film state or a separated bonding member, and a measuring process in which an indentation depth is measured after maintaining a maximum load applied the indenter RBL being pressed to the adhesive layer in the thin film state or the separated bonding member for the predetermined time period.

Figure 7:
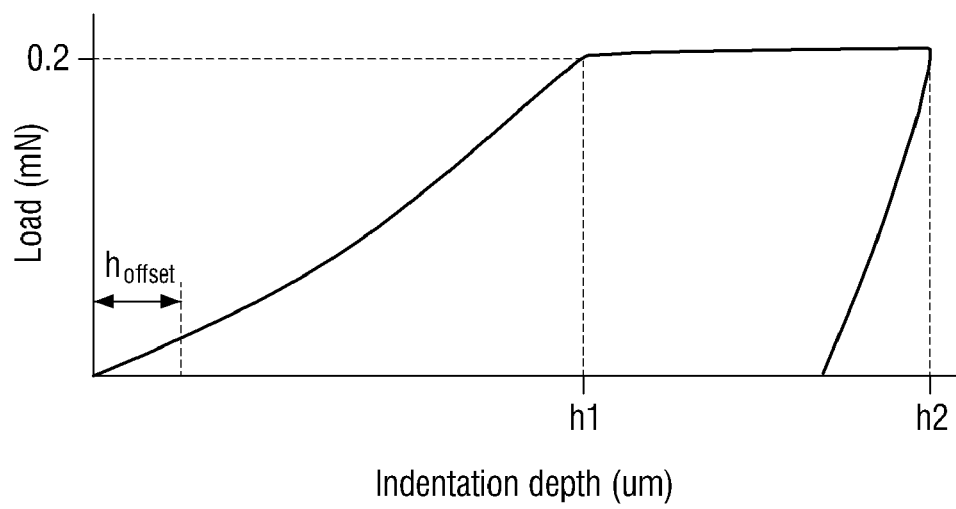
FIG. 7 is a graph showing a relationship between an indentation depth of an adhesive layer and a load applied thereto.
Figure 8:
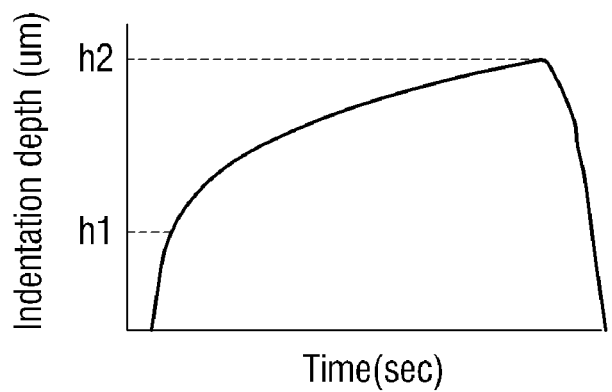
FIG. 8 is a graph showing a relationship between the indentation depth of an adhesive layer over time.

FIG. 7 is a graph showing a relationship between an indentation depth (μm) of an adhesive layer and a load (mN) applied thereto to form an indentation. FIG. 8 is a graph showing a relationship between the indentation depth (μm) of an adhesive layer over time (seconds (sec)) including a maximum load maintenance period. In FIGS. 7 and 8, $h_1$ represents the indentation depth at a point of reaching the maximum load, and $h_2$ represents the indentation depth at an end point of the maximum load maintenance period. The maximum load maintenance period may represent a time period at which the maximum load applied to the adhesive layer via the indenter is maintained.

Referring to FIGS. 7 and 8, the indentation depth of the indenter RBL increases as the indentation load of the indenter RBL increases. As the modulus of the adhesive layer decreases, the strain with respect to the stress increases. Thus, in FIG. 7, the degree of increase of the indentation depth to the indentation load increases as the modulus decreases. The indentation depth continues to increase even while the indenter RBL is maintained at the maximum load due to the viscosity of the adhesive layer PSA. As the creep characteristic increases, generally, the indentation depth tends to increase during the maximum load maintenance period. The rate at which the indentation depth increases during the maximum load maintenance period gradually decreases over time (slope decreases in FIG. 8). If the maximum load maintenance period is prolonged, at a certain time point, the indentation depth can no longer be increased and maintained at a specific value. Reducing a force applied by the indenter RBL (e.g., unloading the indenter RBL) reduces the indentation depth. The greater the restoring force, the smaller the indentation depth after completion of unloading of the indenter RBL.

When the indentation depth is measured as described above, a modulus E* can be calculated by Eq. 1:

$$P = 4/3 E^* \sqrt{R} \sqrt{H^3} \qquad \text{Eq. 1}$$

In Eq. 1, P is the maximum load, R is the radius of the indenter RBL, and h indicates the indentation depth. Here, the indentation depth means a depth reached by application of the maximum load (e.g., $h_1$). When the bio-indenter has a predetermined offset depth $h_{offset}$, the indentation depth of Eq. 1 may be expressed as a value obtained by subtracting an offset depth $h_{offset}$ from the maximum load reaching depth $h_1$ measured by the bio-indenter. The offset depth $h_{offset}$ is a section of the bio-indenter recognized as indentation by van der Waals force on the surface of the adhesive layer while the indenter RBL in in close proximity thereto, but which does not actually contribute to indentation of a target (e.g., the adhesive layer PSA). The actual indentation depth may be calculated as a value obtained by subtracting the offset depth $h_{offset}$ from the indentation depth actually measured by the bio-indenter. In order to reduce measurement errors due to the offset depth $h_{offset}$, the modulus may be calculated by specifying a loading slope range from about 30% to about 98% (e.g., about 0.06 mN to about 0.196 mN) of the maximum load in the indentation depth-load graph.

Further, a creep characteristic $C_{rr}$ can be calculated by Eq. 2:

$$C_{IT} = \frac{h_2 - h_1}{h_1} \cdot 100$$

By allowing each of the bonding members 251-253 and 351-352 of the display device 10 to have appropriate modulus and creep characteristic for each position within a display device 10 as described above, precisely managing the adhesive properties such as defective detachment prevention, restoring force, and peel force for each position of the bonding members 251-253 and 351-352 applied to the display device 10, is possible.

Figure 9:
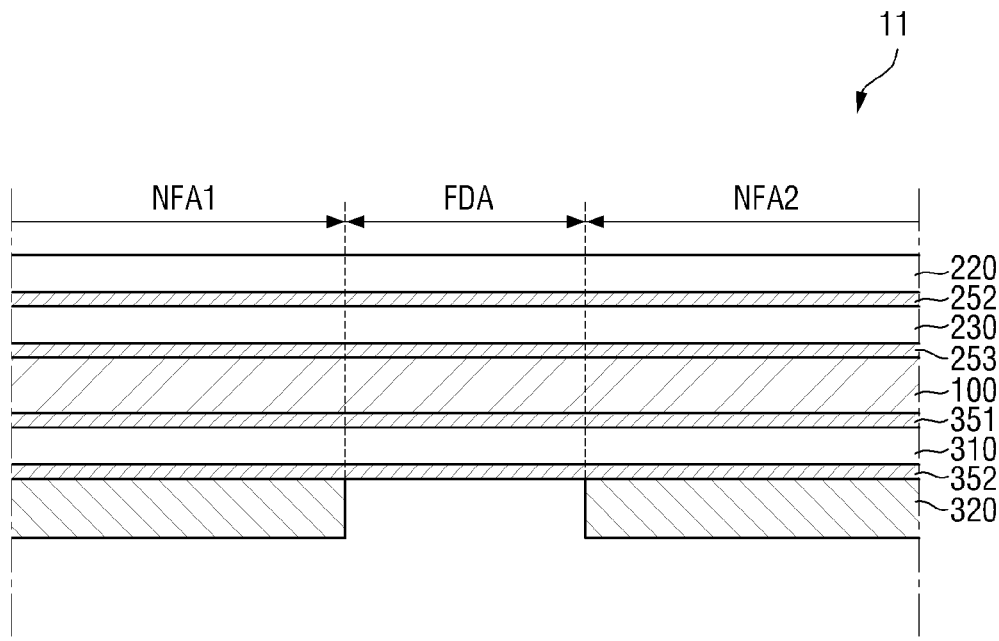
FIG. 9 is an enlarged cross-sectional view of another embodiment of a display device.
Figure 10:
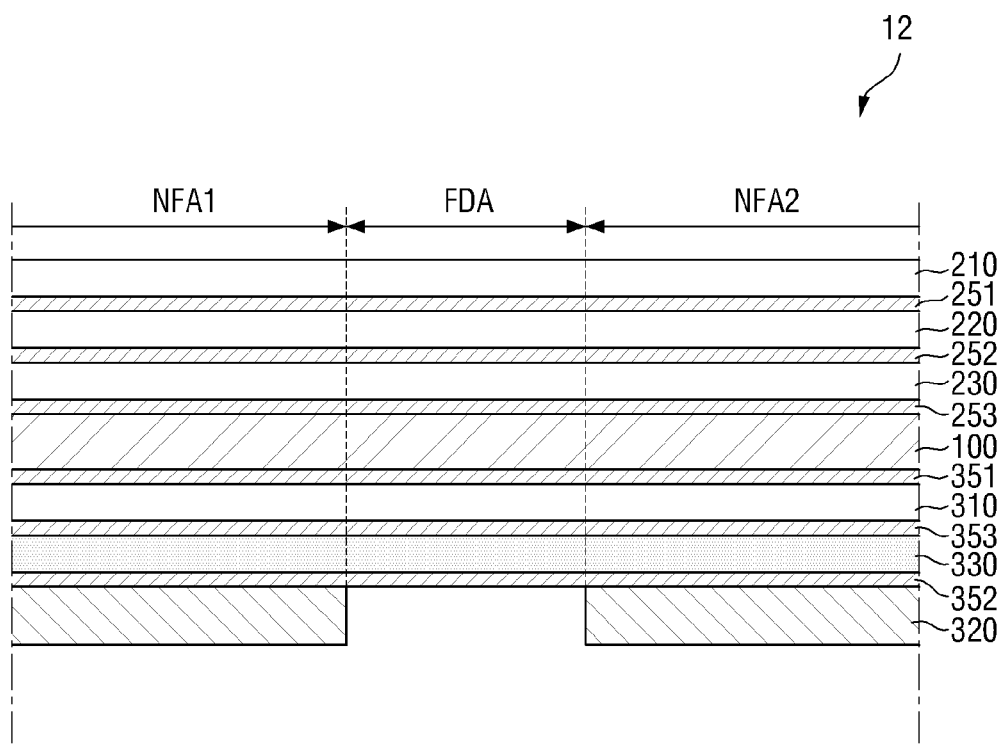
FIG. 10 is an enlarged cross-sectional view of still another embodiment of a display device.
Figure 11:
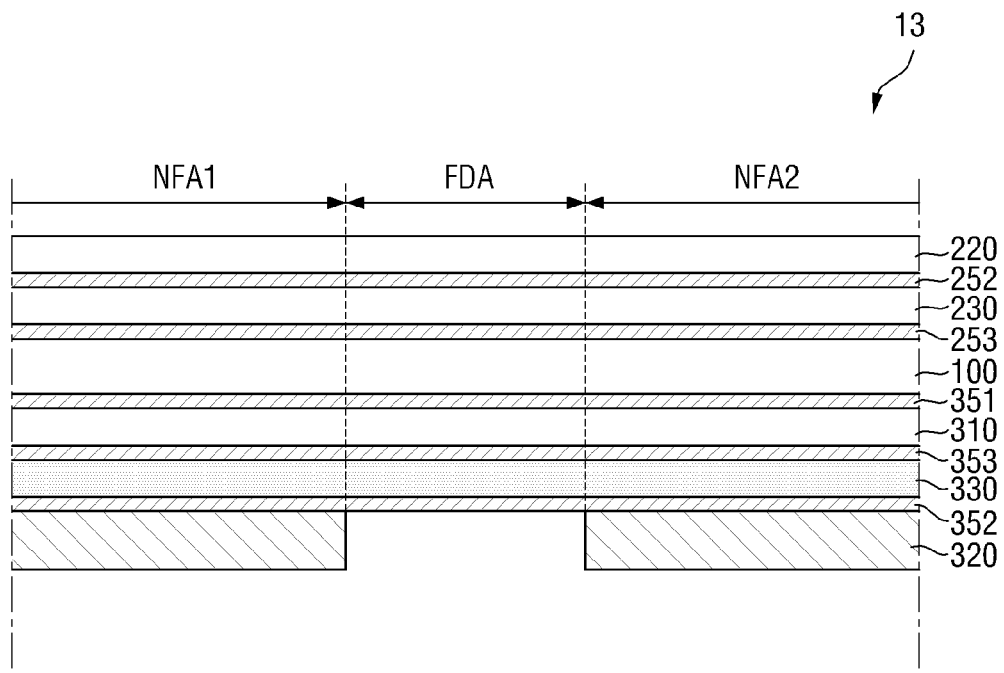
FIG. 11 is an enlarged cross-sectional view of yet another embodiment of a display device.

Hereinafter, other embodiments will be described. FIGS. 9 to 11 illustrate that the display device may have various laminated structures.

FIG. 9 is an enlarged cross-sectional view of another embodiment of a display device.

Referring to FIG. 9, a display device 11 differs from the display device 10 of FIG. 3 in that the cover window protective layer 210 and the first bonding member 251 are omitted. In this embodiment, the modulus of the second bonding member 252 which is measured from an adhesive layer as the thin film state by the indenter is smaller than the modulus of the third to fifth bonding members 253 and 351-352 measured in a similar fashion, and may be in a range of about 50 KPa to about 1 MPa. The modulus of the third to fifth bonding members 253 and 351-352 may be in a range of about 100 KPa to about 10 MPa.

FIG. 10 is an enlarged cross-sectional view of still another embodiment of a display device.

Referring to FIG. 10, a display device 12 differs from the display device 10 of FIG. 3 in that the rear laminated structure 300 further includes a buffer member 330 and a sixth bonding member 353 (e.g., a buffer member bonding member).

Specifically, the buffer member 330 may be disposed between the polymer film layer 310 and the heat dissipation member 320. The buffer member 330 may function to reduce or effectively prevent the display device 12 from being damaged from an external impact incident thereto, by absorbing the external impact. The buffer member 330 may be provided or formed of a single layer or a plurality of single-layer films which are laminated together. The buffer member 330 may be provided or formed to include a material having elasticity such as polyurethane, polyethylene resin or the like. The buffer member 330 may be a cushion layer.

The sixth bonding member 353 is disposed between the buffer member 330 and the polymer film layer 310. The fifth bonding member 352 may be disposed between the buffer member 330 and the heat dissipation member 320. The sixth bonding member 353 may be a buffer member bonding member for attaching the buffer member 330 on the second surface of the display panel 100.

The sixth bonding member 353 may have adhesive properties similar to those of the fifth bonding member 352. In other words, the sixth bonding member 353 may have the same thickness as that of the fifth bonding member 352 or a thickness within a range applicable to the fifth bonding member 352. The modulus of the sixth bonding member 353 which is measured from an adhesive layer as the thin film through the indenter may be in a range of about 100 KPa to about 10 MPa, and the creep characteristic of the sixth bonding member 353 in the thin film state measured through the indenter may be in a range of about 30% to about 70%.

FIG. 11 is an enlarged cross-sectional view of yet another embodiment of a display device.

Referring to FIG. 11, a display device 13 differs from the display device 12 of FIG. 10 in that the cover window protective layer 210 and the first bonding member 251 are omitted. Since the configuration of the present embodiment can be easily understood from the description with reference to FIGS. 4, 9 and 10, a redundant description is omitted.

FIG. 12 is an enlarged cross-sectional view of a modified embodiment of a display device.

Referring to FIG. 12, a display device 14 has the same lamination structure as that of the display device 10 of FIGS. 3 and 4, but differs from the embodiment of FIG. 4 in that the display device 14 is out-folded such that the display surface faces outward.

As described above, the display device 14 which is out-folded, subjects layers of the front laminated structure 200 and the rear laminated structure 300 to forces which are opposite to those in FIG. 4. That is, the front laminated structure 200 may be subjected to tensile stress and the rear laminated structure 300 may be subjected to compressive stress, by the display device 14 which is out-folded. Thus, the adhesive properties required for each bonding member may also be varied from those described for FIG. 4.

Specifically, the average modulus of the fourth bonding member 351 and the fifth bonding member 352 within the rear laminated structure 300 which receives the compressive stress, may be smaller than the average modulus of the first to third bonding members 251 to 253 within the front laminated structure 200 which receives the tensile stress. Further, the fifth bonding member 352 may have a smaller modulus than the fourth bonding member 351 disposed immediately adjacent to the display panel 100. The modulus of the fifth bonding member 352 which is measured by the indenter as described above may be about 50 KPa to about 1 MPa, and the modulus of the first to third bonding members 251 to 253 and the fourth bonding member 351 may be about 100 KPa to about 10 MPa. The modulus of the first to fourth bonding members 251 to 253 and 351 may be at least 2 times and at most 20 times the modulus of the fifth bonding member 352, and may be in a range of about 3 to about 8 times in some embodiments.

In this embodiment, the creep characteristic of each of the first to fifth bonding members 251-253 and 351-352 which is measured by the indenter as described above may be in a range of about 30% to about 70%.

Hereinafter, the embodiments will be described in more detail by way of Production Examples and Experimental Examples.

Production Example 1: Manufacture of Display Device

A plurality of display device samples having a laminated structure as shown in FIG. 4 were prepared (e.g., an assembled sample display device).

Production Example 2: Extraction of Adhesive Sample

Adhesive samples were extracted by separating each layer from one display device sample among the display devices samples according to Production Example 1. The extracted adhesive #1 was applied as a first bonding member, and the adhesive #2 was applied as a second bonding member. The adhesive #3 was applied as a third bonding member, the adhesive #4 was applied as a fourth bonding member, and the adhesive #5 was applied as a fifth bonding member.

Experimental Example 1: Measurement of Modulus and Creep Characteristic

Figure 13:
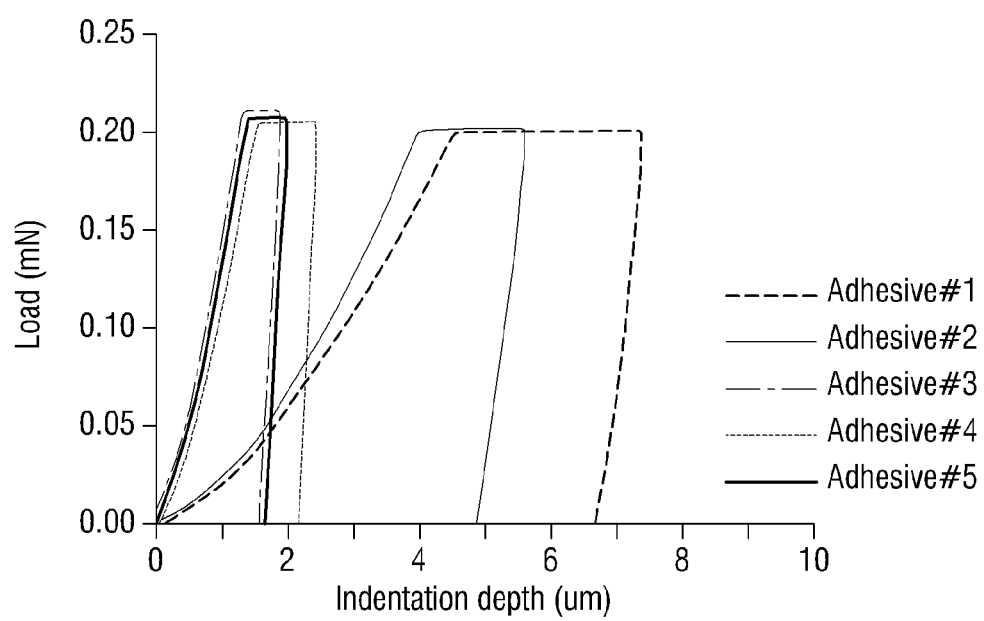
FIG. 13 is a graph showing a relationship between the indentation depth and the load according to an experimental example of adhesive layers separated from a display device.

Each of the adhesive samples was cut into a size of 2 cm×2 cm, and the modulus and creep characteristic were measured by an indenter evaluation method. The indenter evaluation method was conducted by using a ball indenter including or made of a ruby material having a diameter of 1 mm, pressing each sample at a maximum load of 0.2 mN and maintaining the maximum load for 120 seconds. The loading/unloading speed was maintained at 1.2 mN/min. The modulus and creep characteristic were measured by measuring the indentation depth at each point and using the average value. The results were shown in Table 1, and a relationship between the indentation depth and the load according to the measurement results are shown in FIG. 13.

Experimental Example 2: Measurement of Peel Force

Each adhesive sample was attached to a PI substrate or a glass substrate using a 2 kilogram (kg) roller, and aged for 30 minutes. Thereafter, the peel force was measured at a speed of 300 mm/min and at a peeling angle of 180° using a tensile tester (UTM). The results are shown in Table 1 below.

TABLE 1

|  |  | Adhesive #1 | Adhesive #2 | Adhesive #3 | Adhesive #4 | Adhesive #5 |
| --- | --- | --- | --- | --- | --- | --- |
| Indenter | Modulus (Pa) | 5.9E+05 | 8.0E+05 | 3.9E+06 | 3.1E+06 | 3.9E+06 |
|  | Creep characteristic (%) | 66 | 42 | 42 | 62 | 47 |
| Peel force (gf/inch) | PI base material | 300 | 320 | 350 | 280 | 330 |
|  | Glass substrate | 300 | 250 | 290 | 300 | 280 |

Referring to FIG. 13 and Table 1, the adhesives #1 and #2 have a modulus of 50 KPa to 1 MPa, while the adhesives #3, #4 and #5 have a modulus larger than that of the adhesives #1 and #2 and range from 100 KPa to 10 MPa. All the samples exhibit creep characteristics in the range of 30% to 70%, and a peel force relative to both the base film and the glass substrate exhibit values of 200 gf/inch or more.

Experimental Example 3: Folding Reliability Test

An in-folding operation was performed repeatedly 200,000 times at 25 degrees Celsius (° C.) on another display device sample among the display devices samples according to Production Example 1. Even when folding 200,000 times, each bonding member of the display device (e.g., respectively corresponding to the adhesives #1, #2, #3, #4 and #5 showed a steady state without defective detachment, and in-folding reliability of the display device sample was confirmed.

In concluding the detailed description, those skilled in the art will appreciate that many variations and modifications can be made to the embodiments without substantially departing from the principles of the invention. Therefore, the disclosed embodiments of the invention are used in a generic and descriptive sense only and not for purposes of limitation.

What is claimed is:

1. A display device comprising:
    a display panel including a front surface and a rear surface opposite to each other;
    a front laminated structure attached to the front surface of the display panel; and
    a rear laminated structure attached to the rear surface of the display panel,
    wherein
    each of the front laminated structure and the rear laminated structure includes a bonding member, and
    an average indenter-measured modulus of the bonding member within the front laminated structure is smaller than an average indenter-measured modulus of the bonding member within the rear laminated structure.

2. The display device of claim 1, wherein
    the front laminated structure includes a cover window and the bonding member including a window bonding member which is attached to the cover window and disposed between the front surface of the display panel and the cover window, and
    the window bonding member has an indenter-measured modulus of about 50 kilopascals to about 1 megapascal.

3. The display device of claim 2, wherein a creep value of the window bonding member ranges from about 30% to about 70%.

4. The display device of claim 3, wherein
    the window bonding member has a thickness of about 300 micrometers or less to define a thin film window bonding member, and
    the indenter-measured modulus of about 50 kilopascals to about 1 megapascal and the creep value from about 30% to about 70% are measured values of the thin film window bonding member.

5. The display device of claim 3, wherein
    the window bonding member separated from the display device defines a separated window bonding member, and
    the indenter-measured modulus of about 50 kilopascals to about 1 megapascal and the creep value from about 30% to about 70% are indenter-measured values of the separated window bonding member.

6. The display device of claim 5, wherein the indenter-measured values of the separated window bonding member are defined by an indentation depth measuring process, the indentation depth measuring process comprising:
    a loading process in which a load is applied to an indenter while the indenter is being pressed to the separated window bonding member, and
    a measuring process in which an indentation depth is measured after maintaining a maximum load applied the indenter being pressed to the separated window bonding member for a predetermined time period.

7. The display device of claim 6, wherein the indentation depth measuring process further comprises the indenter having a ball shape.

8. The display device of claim 3, wherein
    the front laminated structure further includes a cover window protective layer,
    the bonding member of the front laminated structure further includes a protective layer bonding member which attaches the cover window protective layer to the cover window,
    within the front laminated structure, the protective layer bonding member is further from the display panel than the window bonding member, and
    the protective layer bonding member has an indenter-measured modulus of about 50 kilopascals to about 1 megapascal and a creep value which ranges from about 30% to about 70%.

9. The display device of claim 8, wherein the indenter-measured modulus of the protective layer bonding member is smaller than the indenter-measured modulus of the window bonding member.

10. The display device of claim 3, wherein
    the front laminated structure further includes a polarizing member,
    the bonding member of the front laminated structure further includes a polarizing member bonding member which attaches the polarizing member to the front surface of the display panel,
    within the front laminated structure, the window bonding member is further from the display panel than the polarizing member bonding member,
    the polarizing member bonding member includes an indenter-measured modulus of about 100 kilopascals to about 10 megapascals and a creep value which ranges from about 30% to about 70%, and
    the indenter-measured modulus of the polarizing member bonding member is larger than the indenter-measured modulus of the window bonding member.

11. The display device of claim 3, wherein the rear laminated structure includes:
    a heat dissipation member facing the rear surface of the display panel, and
    a polymer film layer between the heat dissipation member and the rear surface of the display panel.

12. The display device of claim 11, wherein
    the rear laminated structure further includes:
        the bonding member including:
            a polymer film bonding member which attaches the polymer film layer to the rear surface of the display panel, and
            a heat dissipation member bonding member which attaches the heat dissipation member to the polymer film layer,
    an indenter-measured modulus of each of the polymer film bonding member and the heat dissipation member bonding member is about 100 kilopascals to about 10 megapascals and is larger than the indenter-measured modulus of the window bonding member, and
    a creep value of each of the polymer film bonding member and the heat dissipation member bonding member ranges from about 30% to about 70%.

13. The display device of claim 12, wherein
    the rear laminated structure further includes a buffer member disposed between the polymer film layer and the heat dissipation member, the bonding member of the rear laminated structure further includes a buffer member bonding member which attaches the buffer member to the polymer film layer, an indenter-measured modulus of the buffer member bonding member is about 100 kilopascals to about 10 megapascals and is larger than the indenter-measured modulus of the window bonding member, and a creep value of the buffer member bonding member ranges from about 30% to about 70%.

14. The display device of claim 3, wherein the window bonding member has a peel force of 200 gf/inch or more when peeled off at a peeling angle of 180° at a speed of 300 mm/min in a state of being attached on a glass substrate.

15. The display device of claim 1, wherein the front surface of the display panel defines a display screen of the display device at which an image is displayed.

16. The display device of claim 15, wherein
the display device is foldable, and
the display device which is in-folded disposes portions of the display screen facing each other.

17. A display device comprising:
a display panel which is foldable and includes a display surface at which an image is displayed and a rear surface which is opposite to the display surface;
a front laminated structure attached to the display surface of the display panel and foldable together with the display panel, the front laminated structure including a first thin film adhesive layer having a thickness of about 300 micrometers or less and an indenter-measured modulus of about 50 kilopascals to about 1 megapascal; and
a rear laminated structure attached to the rear surface of the display panel and foldable together with the display panel, wherein the display device which 'is in-folded disposes portions of the display surface facing each other with the first thin film adhesive layer therebetween.

18. The display device of claim 17, wherein
the rear laminated structure includes a second thin film adhesive layer having a thickness of about 300 micrometers or less, and
an indenter-measured modulus of the second thin film adhesive layer is about 100 kilopascals to about 10 megapascals and is larger than the indenter-measured modulus of the first thin film adhesive layer.

19. The display device of claim 18, wherein
the front laminated structure further includes a third thin film adhesive layer which is closer to the display panel than the first thin film adhesive layer and has a thickness of about 300 micrometers or less, and
an indenter-measured modulus of the third thin film adhesive layer is about 100 kilopascals to about 10 megapascals and is larger than the indenter-measured modulus of the first thin film adhesive layer.

20. The display device of claim 17, wherein
the indenter-measured modulus of about 50 kilopascals to about 1 megapascal is an indenter-measured value of the first thin film adhesive layer, and
the indenter-measured value of the first thin film adhesive layer is defined by an indentation depth measuring process, the indentation depth measuring process comprising:
a loading process in which a load is applied to an indenter while the indenter is being pressed to the first thin film adhesive layer, and
a measuring process in which an indentation depth is measured after maintaining a maximum load applied the indenter for a predetermined time period.

* * * * *